United States Patent [19]
Baek et al.

[11] Patent Number: 5,751,160
[45] Date of Patent: May 12, 1998

[54] OUTPUT BUFFER WITH IMPROVED OPERATIONAL SPEED AND TRANSITIONAL CURRENT

[75] Inventors: Dae Bong Baek, Kyungki-Do; Sung Hoon Kwak, Seoul, both of Rep. of Korea

[73] Assignee: LG Semicon Co., Ltd., Cheongju, Rep. of Korea

[21] Appl. No.: 756,452

[22] Filed: Nov. 26, 1996

[30]  Foreign Application Priority Data

Dec. 23, 1995 [KR] Rep. of Korea .................. 1995/55618

[51] Int. Cl.$^6$ ........................... H03K 17/14; H03K 17/16
[52] U.S. Cl. ................................. 326/27; 326/32; 326/83
[58] Field of Search .................... 326/27, 32, 33, 326/82, 83, 85, 86, 87; 327/170, 513; 324/391; 307/651

[56]  References Cited

U.S. PATENT DOCUMENTS

| 4,894,561 | 1/1990 | Nogami | 326/83 |
| 5,319,258 | 6/1994 | Ruetz | 307/443 |

Primary Examiner—David R. Hudspeth
Assistant Examiner—Don Phu Le
Attorney, Agent, or Firm—Fleshner & Kim

[57]  ABSTRACT

An output buffer includes inverting units which output a level of signal according to a power voltage and temperature. Since the gates of the transistors in the inverting units have threshold voltages which are controlled to operate according to the power voltage and temperature, the gap between the worst and best case conditions of transitional current and speed is reduced, and the performance of a storage device is optimized.

26 Claims, 3 Drawing Sheets

OUTPUT BUFFER WITH IMPROVED OPERATIONAL SPEED AND TRANSITIONAL CURRENT

TECHNICAL FIELD

The present invention relates to an output buffer, and more particularly, to an output buffer for a storage device.

BACKGROUND ART

As shown in FIG. 1, a general output buffer consists of an inverter 1 for inverting an output enable signal OE, a NOR gate 2 for NORing the output signal of inverter 1 and an input data signal INPUT, an inverter 3 for inverting the output signal of NOR gate 2, and a PMOS transistor 4 having a gate receiving the output signal of inverter 3, a source receiving a power voltage and a drain connected to an output pad IOPAD. The buffer also includes a NAND gate 5 for NANDing output enable signal OE and input data signal INPUT, an inverter 6 for inverting the output signal of NAND gate 5, and a NMOS transistor 7 having a gate receiving the output signal of inverter 6, a grounded source and a drain connected to output pad IOPAD. The reference numeral CL designates an equivalent capacitor connected to output pad IOPAD.

Data output from a memory cell is inverted by an inverter (not shown). This inverted data serves as input data signal INPUT. The input data signal INPUT is inverted by the output buffer of FIG. 1, and is applied to output pad IOPAD. When input data signal INPUT is transited from a low level to a high level and the output buffer is enabled by receiving a high-level output enable signal OE, NOR gate 2 outputs a low-level signal by NORing a high-level input data signal INPUT, and the low-level signal output from inverter 1. Inverter 3 outputs a high-level signal by inverting the received low-level signal. Hence, PMOS transistor 4 is turned off.

The NAND gate 5 outputs a low-level signal by NANDing the high-level input data signal INPUT and output enable signal OE, and inverter 6 outputs a high-level signal by inverting the received low-level signal, which turns off NMOS transistor 7. Accordingly, the low-level signal is externally output through output pad IOPAD.

When input data signal INPUT transists from a high level to a low level and the output buffer is enabled, PMOS transistor 4 is turned on, and NMOS transistor is turned off, according to the operation opposite to the above operation in case that input data signal INPUT is transited from a low level to a high level. Accordingly, the high-level signal is externally output through output pad IOPAD.

However, in the above conventional output buffer, the transitional speed becomes lower at a high temperature and low power voltage, and noise increases at a low temperature and high power voltage. These are the worst case situations for the transitional current and speed.

An output buffer recently disclosed in U.S. Pat. No. 5,319,258, whose disclosure is incorporated herein by reference, is shown in FIG. 2. The output buffer 10 includes a default driver unit 12 which is always active, and a selectable driver unit 14 operated by selection signal SEL, being connected to default driver unit 12. An AND gate 16 performs an AND operation of selection signal SEL and input data signal INPUT, and then outputs the operated result to selectable driver unit 14. An AND gate 18 performs an AND operation of selection signal SEL and inverted input data signal INPUT, and then outputs the operated result to selectable driver unit 14.

A delay block 20 delays input data signal INPUT and outputs the result to default driver unit 12. A delay block 22 delays input data signal INPUT inverted by inverter 17 and outputs the result to default driver unit 12. Default driver unit 12 consists of NMOS transistors MN1 and MN2 connected in series to each other. Selectable driver unit 14 consists of NMOS transistors MNS1 and MNS2 connected in series to each other. Delay blocks 20 and 22 include two inverters connected in series to each other.

In the output buffer disclosed in U.S. Pat. No. 5,319,258, noise is reduced, and speed is improved merely by means of controlling the transition current. However, in order to design the output buffer with regard to reduction of speed and noise, it is required that the speed should be improved in the worst case situations for transitional speed, and transitional current should be reduced in the worst case conditions for transitional current. In the conventional output buffer, since only the operation frequency variation is considered irrelevant to the change of power voltage and temperature, transitional current and speed in the worst condition are not improved.

DISCLOSURE OF THE INVENTION

It is an object of the present invention to provide an output buffer capable of decreasing the gap between the worst and best cases of transitional current and speed.

An advantage of the present invention is in controlling the transitional current which flows through an output pad according to the level of operation power voltage and a temperature.

To accomplish the object of the present invention, there is provided an output buffer comprising: a NAND gate for NAND-operating an output enable signal and input data signal; first inverting means for receiving an output signal of the NAND gate, and generating a predetermined signal level according to voltage and temperature; a first inverter for inverting an output signal of the first inverting means; a first MOS transistor for pulling-up a power level of an output pad according to the output signal of the first inverter; a first NOR gate for NORing the output signals of the first inverter and first inverting means in response to the output signal of the first inverting means; a second MOS transistor for pulling-up the power level of the output pad according to an output signal of the first NOR gate; a second NOR gate for NORing the input data signal and the output enable signal input through the second inverter; second inverting means for receiving an output signal of the second NOR gate, and generating a predetermined signal level according to voltage and temperature; a third inverter for inverting an output signal of the second inverting means; a third MOS transistor for pulling-down the power level of the output pad according to an output signal of the third inverter; a NAND gate for NANDing the output signals of the third inverter and second inverting means in response to the output signal of the second inverting means; and a fourth MOS transistor for pulling-down the power level of the output pad according to an output signal of the NAND gate.

The above and other advantages of the invention are achieved, at least in part, by an output buffer receiving a data signal and responsive to a signal for enabling the output buffer thereby providing an output potential at an output terminal, comprising: a first logic circuit receiving the data signal and the signal; a first inverter coupled to the first logic circuit, the first inverter having a first transistor and a first resistor receiving first and second predetermined voltages, respectively and commonly coupled to a first output node;

first means for one of pulling-up and pulling-down the output potential at the output terminal; and a first logic circuitry responsive to the first output node of the first inverter to control the first means to pull-up or pull-down the output potential at the output terminal.

The above and other advantages of the invention are also achieved, at least in part, by an output buffer receiving a data signal and responsive to an enabling signal to provide an output potential at an output terminal, comprising: a) a first circuitry responsive to the data signal when the data signal transitions from a first state to a second state to pull-up or pull-down the output potential, the first circuitry including i) a first logic circuit receiving the data signal and the enabling signal, ii) a first inverter coupled to the first logic circuit, the first inverter having a first transistor and a first resistor receiving first and second predetermined voltages, respectively, and commonly coupled to a first output node, iii) a first pair of transistors for one of pulling-up and pulling-down the output potential at the output terminal, and iv) a first logic circuitry responsive to the first output node of the first inverter to control the pair of transistors; and b) a second circuitry responsive to the data signal when the data signal transitions from the second state to the first state to pull-down or pull-up the output potential.

Additional advantages, objects and other features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

BEST MODE FOR CARRYING OUT THE INVENTION

Figure 1:
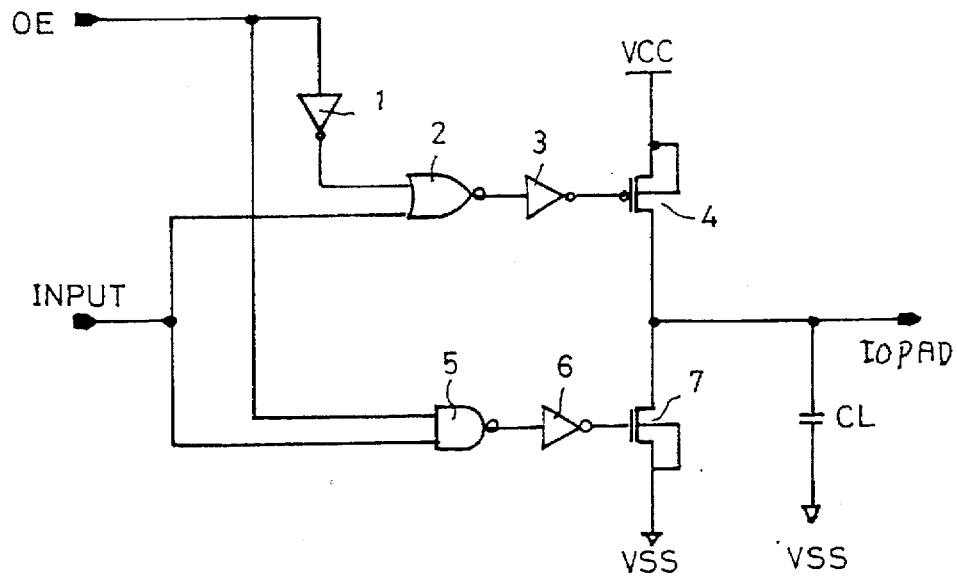
FIG. 1 is a circuit diagram of a conventional output buffer.
Figure 2:
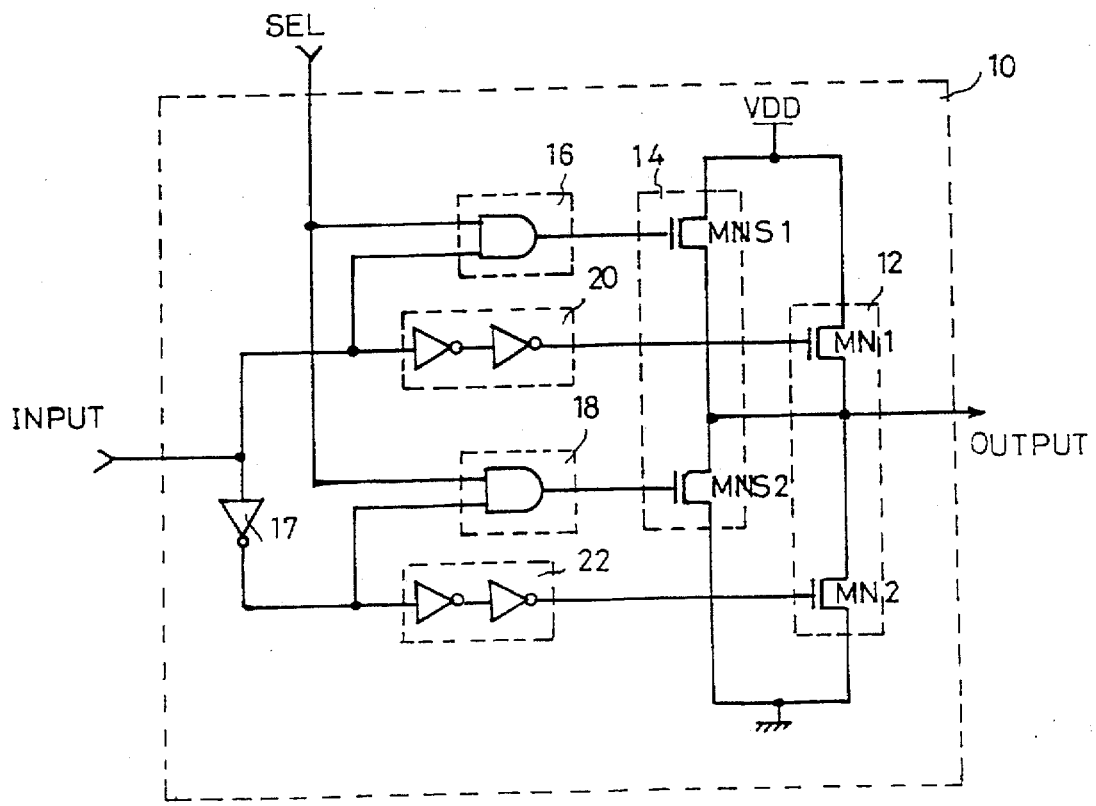
FIG. 2 is a circuit diagram of another conventional output buffer.
Figure 3:
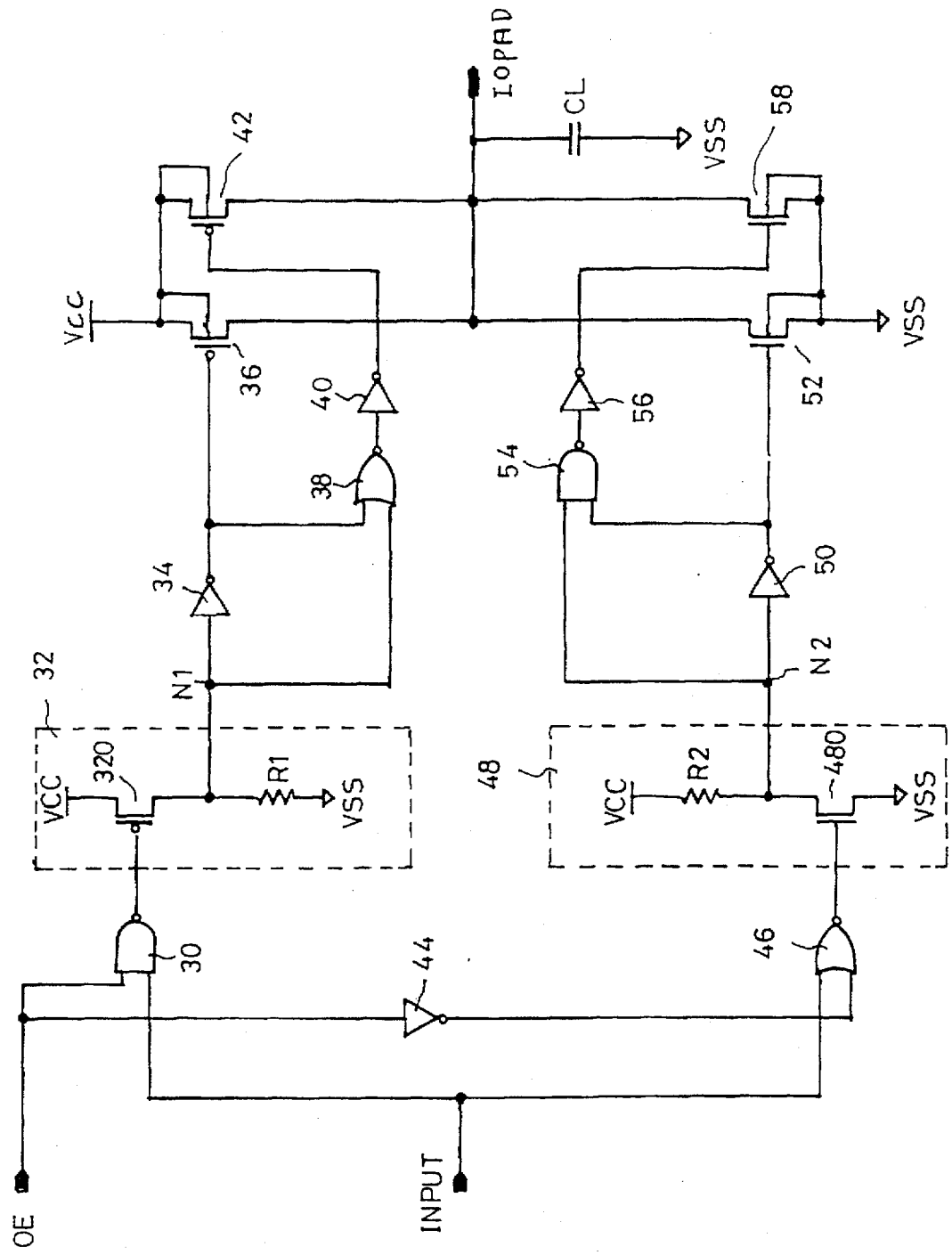
FIG. 3 is a circuit diagram of an output buffer of the present invention.

As shown in FIG. 3, an output buffer of the present invention includes a NAND gate 30 to logically NANDing an output enable signal OE and an input data signal INPUT, and a first inverter 32 for receiving the output signal of first inverter 32, an inverter 34 for inverting the output signal of first inverter 32. A PMOS transistor has a gate receiving the output signal of inverter 34, a source receiving a power voltage VCC and a drain connected to output pad IOPAD.

A NOR gate 38 performs a logical NOR operation of the output signal of first inverter 32 and the output signal of inverter 34, and an inverter 40 to invert the output signal of NOR gate 38. A PMOS transistor 42 has a gate receiving the output signal of inverter 40, a source receiving a power voltage VCC and a drain connected to output pad IOPAD.

An inverter 44 inverts output enable signal OE, and a NOR gate 46 for performing a logical NOR operation of the output signal of inverter 44 and input data signal INPUT. A second inverter 48 receives the output signal of NOR gate 46. An inverter 50 inverts the output signal of second inverter 48, and a NMOS transistor 52 has a gate receiving the output signal of inverter 50, a drain commonly connected to the drain of PMOS transistor 36 and output pad IOPAD, and a grounded source.

A NAND gate 54 performs a logical NAND operation of the output signals of second inverter 48 and inverter 50. An inverter 56 inverts the output signal of NAND gate 54, and a NMOS transistor 58 has a gate receiving the output signal of inverter 56, a drain commonly connected to the drain of PMOS transistor 42 and output pad IOPAD, and a grounded source.

First inverter 32 comprises a PMOS transistor 320 and a resistor R1. The PMOS transistor 320 has a gate receiving the output signal of NAND gate 30, a source receiving power voltage VCC and a drain connected to the input terminals of inverter 34 and NOR gate 38. One electrode of resistor R1 is connected to the drain of PMOS transistor 320 and the other electrode is grounded. Second inverter 48 includes NMOS transistor 480 and a resistor R2.

The PMOS transistor 480 has a gate receiving the output signal of NOR gate 46, a grounded source and a drain connected to the input terminals of inverter 50 and NAND gate 54. One electrode of resistor R2 is connected to the drain of NMOS transistor 480 and the other electrode receives power voltage VCC. The resistors R1 and R2 are polysilicon resistors, and the amount of current which flows therethrough is proportional to power voltage VCC, and inversely proportional to the temperature.

Figure 4A:
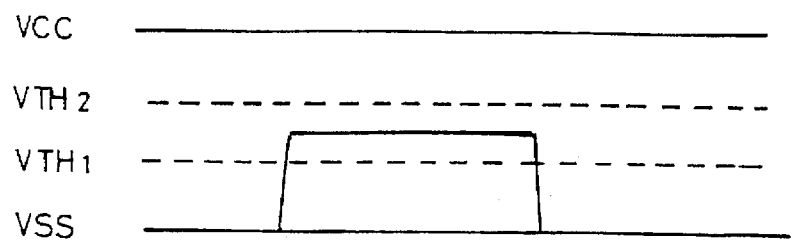
FIGS. 4A and 4B are timing diagrams of an output signal from a first inverter of FIG. 3 at low and high power voltages, respectively, when an input data signal transits from lower level to a higher level.
Figure 4B:
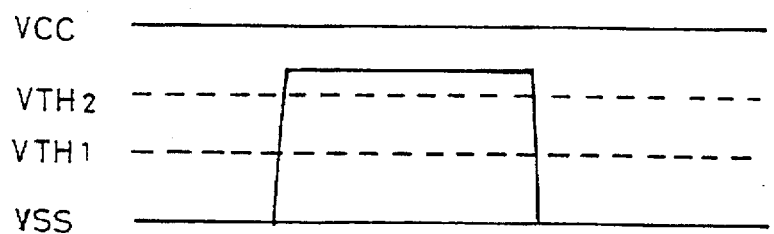
Figure 5A:
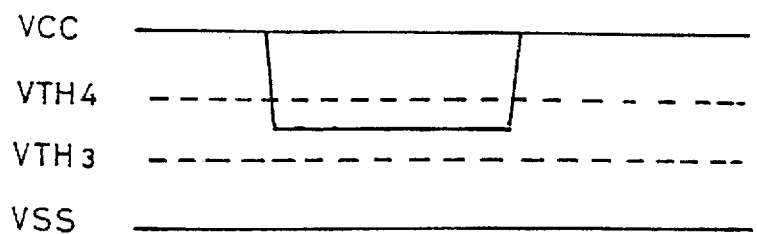
FIGS. 5A and 5B are timing diagrams of an output signal from a second inverter of FIG. 3 at low and high power voltages, respectively, when an input data signal transits from a higher level to a lower level.
Figure 5B:
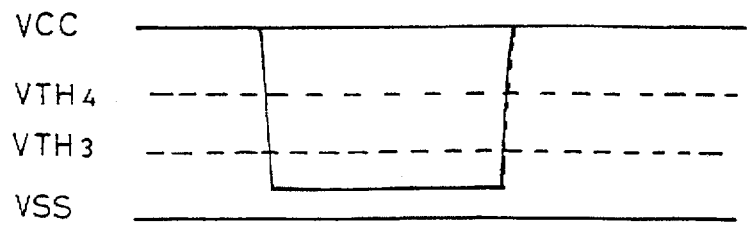

As shown in FIGS. 4A and 4B, inverter 34 has a low threshold voltage $V_{TH}1$, and NOR gate 38 has a high threshold voltage $V_{TH}2$. As shown in FIGS. 5A and 5B, NAND gate 54 has a low threshold voltage $V_{TH}3$, and inverter 50 has a high threshold voltage $V_{TH}4$.

The following explains the operation of the output buffer when input data signal INPUT is transited from a low level to a high level when the output buffer is enabled by receiving a high-level output enable signal OE. First, during the worst case situation for transition speed, i.e., the output buffer receives a low power voltage VCC, for example, 3V, and subject to a high temperature, NAND gate 30 outputs a low level of signal by a NAND operation of the high-level output enable signal OE, and PMOS transistor 320 is turned on.

The high-level voltage ΔV1 equaling R1 time i1 is generated at node N1 according to current i1 flowing through resistor R1. As shown in FIG. 4A, the generated high-level voltage ΔV1 has a level higher than the threshold voltage $V_{TH}1$ of inverter 34, and lower than the threshold voltage $V_{TH}2$ of NOR gate 38.

The voltage ΔV1 enables inverter 34 to output the low-level signal, and PMOS transistor 36 is turned on. However, since voltage ΔV1 is lower than the threshold voltage $V_{TH}2$ of NOR gate 38, NOR gate 38 is not activated, and NOR gate 38 outputs a signal of high-level. In other words, voltage ΔV1 turns on only the grounded NMOS transistor included in NOR gate 38. Accordingly, NOR gate 38 outputs a high-level signal.

Subsequently, inverter 40 outputs a low-level signal by inverting the received signal of high level, and PMOS transistor 42 is turned on. Therefore, even during the worst situation for transition speed, the voltage of output pad IOPAD is pulled-up by PMOS transistors 36 and 42. Thus, after the transition of input data signal INPUT from a low level to a high level, the transitional speed of the output data signal from a low level to a high level becomes faster in the output buffer of the present invention.

Second, during the worst case situation for noise, i.e., the output buffer receives high power voltage VCC, for example, 5V, and subject to a low temperature, as described above. PMOS transistor 320 is turned on. The high-level voltage $\Delta V2(=R1 \times i2)$ is higher than voltage $\Delta V1$ generated at node N1 according to current i2, which flows through resistor R1. As shown in FIG. 4B, the generated high-level voltage $\Delta V2$ has a level higher than the threshold voltage $V_{TH}1$ of inverter 34 and threshold voltage $V_{TH}2$ of NOR gate 38.

The voltage $\Delta V2$ activates inverter 34 and NOR gate 38, and accordingly, inverter 34 outputs a low-level signal. PMOS transistor 36 is turned on. NOR gate 38 outputs a low-level signal, and inverter 40 outputs a high-level signal. Thus, PMOS transistor 42 is turned off. In the worst case situation for noise, the voltage of output pad IOPAD is pulled-up only by PMOS transistor 36. The transition current of input data signal INPUT is reduced, to thereby decrease the noise in the present invention.

Meanwhile, when input data signal INPUT is transited from a low level to a high level, NOR gate 46 outputs a low-level signal by a NOR operation of the high-level input data signal INPUT and low-level signal output from inverter 44, which turns off NMOS transistor 480. Accordingly, NMOS transistors 52 and 58 are turned off.

The following explains the operation of the present invention with reference to FIGS. 5A and 5B when input data signal INPUT transits from a high level to a low level and the output buffer is enabled by receiving high-level output enable signal OE. First, during the worst case situation for transitional speed, NOR gate 46 outputs a high-level signal by a NOR operation of the low-level input data signal INPUT and the low-level signal output from inverter 44. The NMOS transistor 480 is turned on and a low-level voltage $\Delta V3(=R2 \times i3)$ is generated due to the current i3 flowing through resistor R2. Hence, a low-level voltage of VCC-$\Delta V3$ is generated at node N2. As shown in FIG. 5A, the generated low-level voltage VCC-$\Delta V3$ has a level higher than the threshold voltage $V_{TH}3$ of NAND gate 54, and lower than the threshold voltage $V_{TH}4$ of inverter 50.

Accordingly, low-level voltage VCC-$\Delta V3$ enables inverter 50 to output the high-level signal, and NMOS transistor 52 is turned on. However, since voltage VCC-$\Delta V3$ is higher than the threshold voltage $V_{TH}3$ of NAND gate 54, NAND gate 54 is not activated and NAND gate 54 outputs a low-level signal. Accordingly, inverter 56 outputs a high-level signal by inverting the received low-level signal, and NMOS transistor 58 is turned on. In the worst case condition for transitional speed, the voltage of output pad IOPAD is pulled-down by NMOS transistors 52 and 58. After the transition of input data signal INPUT from a high level to a low level, the transitional speed of the output data signal from a high level to a low level becomes faster in the present invention.

During the worst case condition for noise, as described above, NMOS transistor 480 is turned on. A voltage $\Delta V4$ (=R2×i4) which is higher than voltage $\Delta V3$ is generated due to current i4 flowing through resistor R2, and low-level voltage VCC-$\Delta V4$ is generated at node N2. As shown in FIG. 5B, the generated low-level voltage VCC-$\Delta V4$ has a level lower than both threshold voltage $V_{TH}3$ of NAND gate 54 and the threshold voltage $V_{TH}4$ of inverter 50.

Accordingly, low-level voltage VCC-$\Delta V4$ enables inverter 50 to output the high-level signal, and NMOS transistor 52 is turned on. Further, low-level voltage VCC-$\Delta V4$ enables NAND gate 54 to output the high-level signal and inverter 56 outputs a low-level signal, which turns NMOS transistor 58 off. In the worst case condition for noise, the voltage of output pad IOPAD is pulled-down only by NMOS transistor 52 so that the transitional current of input data signal INPUT is reduced in the present invention, which decreases noise.

Meanwhile, in a condition where input data signal INPUT transits from a high level to a low level, NAND gate 30 outputs high-level signal by a logical NAND operation of low-level input data signal INPUT and high-level output enable signal OE. Thus, PMOS transistor 320 is turned off, and PMOS transistors 38 and 42 are turned off.

The output buffer of the present invention has various advantages. By controlling the output driving capability according to the power voltage and temperature, the output driving capability is increased even during worst case situations for transitional speed. The transitional speed of the output data signal becomes faster after the transition of the input data signal. Further, the transitional current is decreased even during the worst case situation for noise, and thereby reducing noise.

In the situation where a wide range of power voltage and temperature is applied to the output buffer, the gap in the operation of the output buffers during the worst and best case conditions is decreased. The performance of a memory device, including the output buffer, is optimized. Moreover, a voltage sensing circuit which is used for sensing the level of power voltage is not required, and hence, the circuit size is decreased.

The foregoing embodiment is merely exemplary and not to be construed as limiting the present invention. The present invention can be readily applied to other type of output buffers. One of ordinary skill in the art can use the teachings of the present invention to other devices with reduced gap during the worst and best conditions. The description of the present invention is intended to be illustrative, and not limiting the scope of the claims. Many alternatives, modifications and variations will be apparent to those skilled in the art.

We claim:

1. An output buffer comprising:

a first NAND gate for NAND-operating an output enable signal and input data signal;

first inverting means for receiving an output signal of said first NAND gate, and generating a predetermined signal level according to voltage and temperature;

a first inverter for inverting an output signal of said first inverting means;

a first MOS transistor for pulling-up a power level of an output pad according to the output signal of said first inverter;

a first NOR gate for NORing the output signals of said first inverter and first inverting means in response to the output signal of said first inverting means;

a second MOS transistor for pulling-up the power level of the output pad according to an output signal of the first NOR gate;

a second inverter for inverting the output enable signal;

a second NOR gate for NORing said input data signal and said output enable signal input through said second inverter;

second inverting means for receiving an output signal of said second NOR gate, and generating a predetermined signal level according to voltage and temperature;

a third inverter for inverting an output signal of said second inverting means;

a third MOS transistor for pulling-down the power level of said output pad according to an output signal of said third inverter;

a second NAND gate for NANDing the output signals of said third inverter and second inverting means in response to the output signal of said second inverting means; and a fourth MOS transistor for pulling down the power level of said output pad according to an output signal of said second NAND gate.

2. The output buffer of claim 1, wherein said first inverting means comprises:

a PMOS transistor having a gate receiving the output signal of said first NAND gate and a source receiving power voltage; and a polysilicon resistor, one side of which is connected to a drain of said PMOS transistor and the other side of which is grounded.

3. The output buffer of claim 1, wherein said second inverting means comprises:

a NMOS transistor having a gate receiving the output signal of said second NOR gate and a grounded source; and a polysilicon resistor, one side of which is connected to a drain of said NMOS transistor and the other side of which receives a power voltage.

4. The output buffer of claim 1, wherein said first NOR gate has a threshold voltage higher than that of said first inverter, said gate not responding to a low-level power voltage.

5. The output buffer of claim 1, wherein said second NAND gate has a threshold voltage lower than that of said third inverter, said gate not responding to a low-level power voltage.

6. The output buffer of claim 1, wherein said second MOS transistor is a PMOS transistor having a gate receiving the output signal of said inverted first NOR gate, a source receiving a power voltage, and a drain connected to said output pad.

7. The output buffer of claim 1, wherein said fourth MOS transistor is a NMOS transistor having a gate receiving the output signal of said second NAND gate, a grounded source, and a drain connected to said output pad.

8. An output buffer receiving a data signal and responsive to an enable signal for enabling the output buffer thereby providing an output potential at an output terminal, comprising:

a first logic circuit receiving the data signal and the enable signal;

a first inverter coupled to said first logic circuit, said first inverter having a first transistor and a first resistor receiving first and second predetermined voltages, respectively and commonly coupled to a first output node;

first means for one of pulling-up and pulling-down the output potential at the output terminal; and a first logic circuitry responsive to said first output node of said first inverter to control said first means to pull-up or pull-down the output potential at the output terminal.

9. The output buffer of claim 8 further comprising:

a second logic circuit receiving the data signal and the enable signal which as been inverted;

a second inverter coupled to said second logic circuit, said second inverter having a second transistor and a second resistor receiving second and first predetermined voltages, respectively, and commonly coupled to a second output node; second means for one of pulling-up and pulling-down the output potential at the output terminal; and a second logic circuitry responsive to said second output node of said second inverter to control said second means to pull-up or pull-down the output potential at the output terminal.

10. The output buffer of claim 9, wherein first means pull-up the output potential at the output terminal when the data signal transitions from a first state to a second state, and said second means pulls-down the output potential at the output terminal when the data signal transitions from the second state to the first state.

11. The output buffer of claim 10, wherein said first logic circuit is a logical NAND gate, and said second logic circuit is a logical NOR gate.

12. The output buffer of claim 9, wherein said first and second predetermined voltages are power supply and ground potentials, respectively.

13. The output buffer of claim 8, wherein said first logic circuitry comprises:

a first logic device coupled to said first output node and said first means;

a second logic device coupled to an output of said first logic device; and a third logic device coupled to an output of said second logic device and said first means, wherein said first logic device has a lower threshold voltage than said second logic device.

14. The output buffer of claim 13, wherein said first logic and third logic devices are the same logic gate type, and said second logic device is a NOR gate.

15. The output buffer of claim 14, wherein said first and third logic devices are inverters.

16. The output buffer of claim 8, wherein said first means comprises a first pair of transistors coupled in parallel, first electrodes of said first pair being connected to one of said first and second predetermined voltages and second electrodes of said first pair being connected to said output terminal, and gate electrodes being coupled to corresponding output of said first logic circuitry.

17. The output buffer of claim 9, wherein said second logic circuitry comprises:

a first logic device coupled to said second output node and said second means;

a second logic device coupled to an output of said first logic device; and a third logic device coupled to an output of said second logic device and said second means, wherein said first logic device has a higher threshold voltage than said second logic device.

18. The output buffer of claim 17, wherein said first logic and third logic devices are the same logic gate type, and said second logic device is a NAND gate.

19. The output buffer of claim 18, wherein said first and third logic devices are inverters.

20. The output buffer of claim 9, wherein said second means comprises a second pair of transistors coupled in parallel, first electrodes of said first pair being connected to one of said first and second predetermined voltages and second electrodes being connected to said output terminal, and gate electrodes being coupled to corresponding output of said second logic circuitry.

21. The output buffer of claim 16, wherein said first pair of transistors and said first transistor comprise PMOS transistors.

22. The output buffer of claim 20, wherein said second pair of transistors and said second transistor comprise NMOS transistors.

23. An output buffer receiving a data signal and responsive to an enabling signal to provide an output potential at an output terminal, comprising:

a) a first circuitry responsive to said data signal when the data signal transitions from a first state to a second state to pull-up or pull-down the output potential, said first circuitry including i) a first logic circuit receiving the data signal and the enabling signal, ii) a first inverter coupled to said first logic circuit, said first inverter having a first transistor and a first resistor receiving first and second predetermined voltages, respectively, and commonly coupled to a first output node, iii) a first pair of transistors for one of pulling-up and pulling-down the output potential at the output terminal, and iv) a first logic circuitry responsive to said first output node of said first inverter to control said pair of transistors; and b) a second circuitry responsive to the data signal when the data signal transitions from said second state to said first state to pull-down or pull-up the output potential.

24. The output buffer of claim 23, wherein said second circuitry comprises:

a second logic circuit receiving the data signal and the enabling signal which has been inverted;

a second inverter coupled to said second logic circuit, said second inverter having a second transistor and a second resistor receiving to second and first predetermined voltages, respectively, and commonly coupled to a second output node;

a second pair of transistors for one of pulling-down and pulling-up the output potential at the output terminal; and a second logic circuitry responsive to said second output node of said second inverter to control said pair of transistors to pull-down or pull-up the output potential at the output terminal.

25. The output buffer of claim 23, wherein said first logic circuitry comprises:

a second inverter coupled to said first output node and one of said pair of first transistors;

a NOR gate coupled to said first output node and receiving an output of said second inverter; and a third inverter receiving an output of said NOR gate and one of said pair of first transistors, wherein said first inverter has a lower threshold voltage than said NOR gate.

26. The output buffer of claim 24, wherein said second logic circuitry comprises:

a second inverter coupled to said second output node and one of said second pair of transistors;

a NAND gate coupled to an output of said inverter and to said second output node; and a third inverter coupled to an output of said NAND gate and one of said second pair of transistors, wherein said first inverter has a higher threshold voltage than said NAND gate.

\* \* \* \* \*